Dec. 10, 1963 W. M. ABERCROMBIE 3,114,088

GALLIUM ARSENIDE DEVICES AND CONTACT THEREFOR

Filed Aug. 23, 1960

INVENTOR
Wava M. Abercrombie

BY Stevens, Davis, Miller & Mosher
ATTORNEYS 3,114,088

United States Patent Office 3,114,088
Patented Dec. 10, 1963

3,114,088

GALLIUM ARSENIDE DEVICES AND CONTACT THEREFOR

Wava M. Abercrombie, Dallas, Tex., assignor to Texas Instruments Incorporated, Dallas, Tex., a corporation of Delaware Filed Aug. 23, 1960, Ser. No. 51,323
2 Claims. (Cl. 317—237)

This invention relates to semiconductor devices and more particularly to gallium arsenide devices and the means and method for producing them.

Semiconductor materials have come into prominence recently because of their usefulness in making such devices as transistors, diodes, rectifiers, photoelectric devices, and thermoelectric devices, among others.

Certain elements of group IV*a* of the periodic table of elements, i.e. carbon, silicon, germanium and tin, have in common the characteristics requisite for semiconductor materials. (As used herein, the periodic table of elements shall mean that table according to Mendelejeff as now generally portrayed.) However, because of the difficulty of synthetic production of the diamond form of carbon and the instability of the diamond lattice in tin, the semiconductor materials first used, and now most commonly used, in devices of the type mentioned above are germanium and silicon.

Nevertheless, because of certain inherent limitations of germanium and silicon as semiconductor materials and because of the difficulties of producing and maintaining the diamond lattice structure in tin and carbon, experimenters have been diligently searching for other and better semiconductor materials. The so-called compound semiconductor materials which are comprised of an element from group III*a* and an element from group V*a* of the periodic table as disclosed in U.S. Patent No. 2,798,-989 to Welker appear superior to the group IV*a* semiconductors in many of their characteristics.

Because of the possibility of wider range of selection and different combinations of various semiconductor characteristics, the III*a*–V*a* compounds offer many advantages over germanium and silicon as semiconductors. For example, various combinations of group III*a* and group V*a* elements offer energy gaps ranging from 0.45 electron volt to 1.6 electron volts and carrier mobilities up to twenty times that of silicon.

Of the group III*a*–V*a* semiconductor compounds, gallium arsenide apparently has the greatest potential as a semiconductor material. Its forbidden energy band is higher than silicon and its carrier mobility is very nearly that of germanium. Thus, gallium arsenide semiconductor devices will have very good high frequency response, and will be operative up to temperatures of about 400° C.

Despite the inherent advantages of gallium arsenide and others of the compound semiconductors, certain difficulties have prevented their use in semiconductor devices to any important degree, as yet. Among these are the difficulties of producing a material of the requisite purity, and the difficulties of adding required amounts of significant impurities or "dopes" to the material to produce the P- and N-type regions required in useful devices.

The significant P-type impurities (group III*a* elements, boron, aluminum, gallium and indium) and the significant N-type impurities (group V*a* elements, phosphorus, arsenic, and antimony) used with the group IV*a* semiconductor materials of silicon and germanium are relatively easy to control in the various growing, alloying and diffusion processes used in the fabrication of devices. Although the P-type significant impurities (acceptors) of group II*a* of the periodic table for the III*a*–V*a* compound semiconductor materials have proved manageable, and the N-type impurities (donors) of group VI*a* of the periodic table, although quite difficult to handle because of their high vapor perssure, are workable, the search continues for better and more manageable impurity materials.

It was postulated by the art that when elements selected from groups III*a*, IV*a*, and V*a* of the periodic table were used as impurity materials, they would exert no substantial influence as regards conductivity type of the parent III*a*–V*a* compound semiconductor material. Thus, group IV*a* elements would enter the crystal lattice substitutionally in atom pairs, group V*a* elements would substitute for the group V*a* element of the compound semiconductor, and group III*a* elements would substitute for the group III*a* element of the compound semiconductor. There has been some substantiation of this line of thinking in the literature and some confirmation by experimentation.

In one particular case, providing direct aluminum contact to gallium arsenide, the literature indicates that probably aluminum will enter gallium arsenide crystal lattice structure substituting for gallium to form an ohmic contact. To support this theory it is noted that both elements appear in group III*a* and that they have about the same covalent radii. Attempts to pove this theory by actual experiments have also been reported. Unfortunately, the reported experiments were unsuccessful, failure being attributed to the difficulty of initiating wetting of the molten aluminum to gallium arsenide.

To overcome the obstacles encountered, a contact has been proposed in the prior art that is obtained by alloying indium to gallium arsenide, etching away excess indium down to the recrystallized region, electroplating an aluminum film onto the recrystallized region and then alloying an aluminum dot to the plated aluminum film. Excellent ohmic contacts are reported using this proposed technique—resistances below one ohm and operability at temperatures above 400° C.

In direct opposition to the teachings and experiments of the prior art, it has now been discovered, quite unexpectedly, that a direct aluminum contact can be made to gallium arsenide and when made to N-type gallium arsenide the contact, surprisingly, is rectifying and not ohmic. Unfortunately, the research has not progressed sufficiently to explain this phenomenon. There are, however, several theoretical explanations which will be presented hereinafter.

Accordingly, it is the principal object of this invention to provide a direct aluminum contact to gallium arsenide and more particularly a direct aluminum rectifying contact to N-type gallium arsenide.

A further object of this invention is to provide a novel method for making a rectifying contact to N-type gallium arsenide.

It is a still further object of this invention to provide novel gallium arsenide semiconductor devices.

Other and further objects of the present invention will become more apparent from the following description of preferred embodiments of the present invention when taken in conjunction with the appended claims and the attached drawing, in which:

FIGURE 1 portrays in perspective a gallium arsenide device having an aluminum plate as one electrode;

Figures 1, 2, 3:
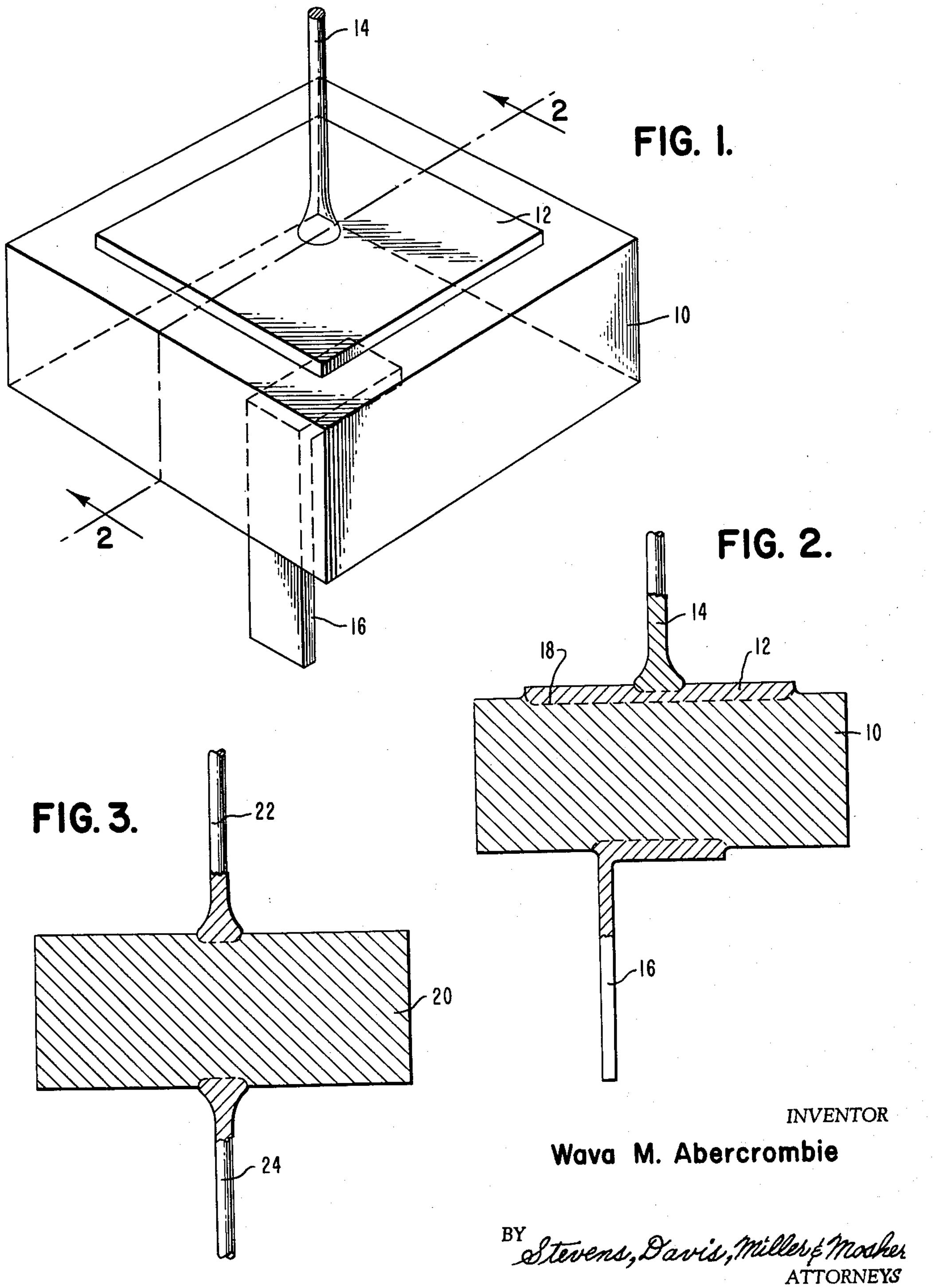
FIGURE 2 is a sectional view taken along line 2—2 of FIGURE 1.
FIGURE 3 shows in section a view similar to FIGURE 2 illustrating the use of an aluminum wire electrode as an alternative embodiment of the invention.

Referring now to the drawing, the present invention will be described with reference to specific preferred embodiments. Also the preferred mode for carrying out the invention will be explained.

In FIGURE 1, there is shown a die or wafer 10 of N-type gallium arsenide. The gallium arsenide can be a single crystal or of polycrystalline form. Any suitable conductivity-producing impurity can be included in the gallium arsenide to make it exhibit N-type conductivity.

Attached to the upper surface of the die 10 and in direct and intimate contact therewith is an aluminum plate 12 to which is attached an aluminum wire 14. The aluminum plate 12 forms a rectifying connection with the N-type gallium arsenide surface. Attached to the opposite face of the die 10 is an ohmic contact comprised of a gold-antimony alloy tab 16.

As noted, the direct and intimate contact between the aluminum plate 12 and surface of the die 10 produces a rectifying P-N junction to which the reference numeral 18 is applied in FIGURE 2. Both the plate 12 and tab 16 are alloyed into the wafer 10.

In FIGURE 3, there is shown a modification of the invention. In this case, the device consists of a gallium arsenide die 20 of N-type conductivity to which is attached an aluminum wire 22 in direct and intimate contact forming a rectifying connection and a wire 24 which may be of any suitable material that will form an ohmic connection with N-type gallium arsenide. Both wires are alloyed to the wafer 20.

To better understand the present invention, a detailed description of a specific example will now be given. A wafer of gallium arsenide of polycrystalline formation was prepared having a thickness of about 20 mils and about 130 mils square. The material had a resistivity of about 0.01 ohm centimeters and exhibited N-type conductivity. The wafer was placed in a suitable vacuum evaporating apparatus, and by conventional processes a thin aluminum film of approximately 100 microns thickness was evaporated onto one face or surface of the gallium arsenide wafer. Thereafter, the wafer and film were heated to approximately 650° C. to cause the film to wet and alloy into the surface of the gallium arsenide wafer. The heating operation was performed in a furnace containing a reducing atmosphere although any non-oxidizing atmosphere is acceptable for this operation. Knowledge of the exact temperature required for the wetting to occur is not necessary as the wetting and alloying can be visually observed. The approximate temperature is stated as a guide to performing the wetting and alloying step of the process. At the same time, an aluminum wire was alloyed onto the aluminized surface. The aluminum contact areas were then masked by polystyrene, and the wafer was etched in a suitable gallium arsenide etch medium (a suitable etch would be that described in Patent 2,619,414 which is now commonly referred to as CP–4 and consists of a mixture of glacial acetic acid, hydrofluoric acid (48%) and concentrated nitric acid (sp. gr. 1.42) which is saturated with bromine at room temperature) to remove any traces of aluminum from the edges and other unmasked areas of the wafer. Whereas polystyrene was selected as the coating material for etch masking, it will be appreciated that other substances are suitable for this purpose. Also any suitable etch can be used. A gold tab containing a minor proportion of antimony (about 1%) was then secured to the opposite face of the wafer by a conventional alloying process to produce an ohmic contact.

The device as prepared in the foregoing was tested, and it exhibited currents up to 1.5 amperes in the forward direction before heating became sufficient to change the diode characteristics.

A further illustration of the present invention concerns the preparation of a diode device as illustrated in FIGURE 3 of the drawing. In this case, a pure aluminum wire was alloyed into a gallium arsenide surface by raising the temperature quickly from room temperature to a temperature at which wetting and alloying occur. The wetting and alloying in this example was conducted in a microfurnace on a strip heater maintained at about 800° C. (such microfurnaces with strip heaters are usual laboratory equipment) under a forming gas atmosphere (hydrogen-nitrogen-argon) which is a procedure well known to those skilled in the art. The approximate temperature is stated as a guide to describe the rapid temperature rise to cause wetting and alloying of the aluminum wire to the gallium arsenide. The gallium arsenide used in this example is of the same material as was used in the previous example. The alloy region was well formed and when tested was found to be rectifying in nature.

Further, it should be appreciated that the aluminum material used to form a contact to the gallium arsenide may be heated to any temperature at which wetting and alloying occurs. As noted in the specific example, an oven temperature of approximately 650° C. was sufficient to cause wetting and alloying between the aluminum film and the gallium arsenide wafer, whereas wetting and alloying between the aluminum wire and gallium arsenide was achieved on a strip heater at approximately 800° C. It should be appreciated that under varying (extremely good) conditions of very fresh and clean surfaces, wetting and alloying could be obtained at a temperature as low as 280° C. or less. In the absence of oxygen, wetting and alloying could be obtained at 575° C. Further, it should be remembered that wetting and alloying can be visually observed and the exact temperature at which it occurs is of minor importance.

As noted previously, the explanation for why the aluminum forms a rectifying contact is not known. There are, however, at least two theories as to what possibly may be happening. The first theory is that the regrowth area produced during alloying of the aluminum to N-type gallium arsenide is some aluminum gallium arsenide alloy having a segregation coefficient such that N-type impurities are excluded from the regrowth area leaving this area with an intrinsic (high resistivity) P-type conductivity. The other theory is that aluminum exhibits a getter action and combines with N-type impurities of the regrowth region formed in the alloying process; hence P-type conductivity prevails. Whether either of these theories is correct, or neither is correct, matters little, as it has been shown by this invention that the aluminum can be made to form a rectifying contact with N-type gallium arsenide.

Although the present invention has been shown and described in terms of specific preferred embodiments, nevertheless, it will be appreciated that various changes and modifications will occur to those skilled in the art which do not in fact depart from the teachings in the present invention. Such changes are deemed to be within the spirit and scope of the present invention as defined by the appended claims.

What is claimed is:

1. A gallium arsenide device comprising a gallium arsenide body of N-type conductivity and an aluminum electrode forming rectifying contact to said gallium arsenide body.

2. A gallium arsenide device comprising a wafer of gallium arsenide having an N-type conductivity region, and an aluminum electrode forming a rectifying junction with said N-type region.

References Cited in the file of this patent

UNITED STATES PATENTS

| | | |
|---|---|---|
| 2,916,408 | Freedman | Dec. 8, 1958 |
| 2,979,428 | Jenny et al. | Apr. 11, 1961 |
| 3,027,501 | Pearson | Mar. 27, 1962 |

OTHER REFERENCES

Properties of Elemental and Compound Semiconductors, vol. 5, Interscience Publishers, New York, London, September 1959, relied on page 49.